(12) United States Patent
Sakaniwa et al.

(10) Patent No.: US 12,177,962 B2
(45) Date of Patent: Dec. 24, 2024

(54) INSULATING RESIN CIRCUIT SUBSTRATE

(71) Applicant: MITSUBISHI MATERIALS CORPORATION, Tokyo (JP)

(72) Inventors: Yoshiaki Sakaniwa, Saitama (JP); Toyo Ohashi, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 20 days.

(21) Appl. No.: 17/928,356

(22) PCT Filed: May 31, 2021

(86) PCT No.: PCT/JP2021/020707
§ 371 (c)(1),
(2) Date: Nov. 29, 2022

(87) PCT Pub. No.: WO2021/246374
PCT Pub. Date: Dec. 9, 2021

(65) Prior Publication Data
US 2023/0319975 A1    Oct. 5, 2023

(30) Foreign Application Priority Data
Jun. 1, 2020    (JP) .................... 2020-095304

(51) Int. Cl.
*H05K 1/02*    (2006.01)
*H05K 1/03*    (2006.01)
*H05K 3/00*    (2006.01)

(52) U.S. Cl.
CPC ......... *H05K 1/0209* (2013.01); *H05K 1/0313* (2013.01); *H05K 3/0061* (2013.01); *H05K 2201/0154* (2013.01); *H05K 2201/10227* (2013.01)

(58) Field of Classification Search
CPC ........................ H05K 1/0209; H05K 3/0061
See application file for complete search history.

(56) References Cited

U.S. PATENT DOCUMENTS

| 2006/0157351 | A1  | 7/2006 | Oda |
| 2012/0092833 | A1* | 4/2012 | Chang ................. H05K 1/0209 |
|  |  |  | 361/710 |
| 2021/0020557 | A1  | 1/2021 | Sakaniwa et al. |

FOREIGN PATENT DOCUMENTS

| JP | 2015-207666 A  | 11/2015 |
| JP | 2018-147934 A  | 9/2018  |
| JP | 2019-169540 A  | 10/2019 |
| WO | 2019/181428 A1 | 9/2019  |

OTHER PUBLICATIONS

International Search Report mailed Jul. 20, 2021, issued for PCT/JP2021/020707 and English translation thereof.
Search Report issued in European Patent Application No. EP 21817413.4, mailed Jun. 11, 2024.

\* cited by examiner

*Primary Examiner* — Jeremy C Norris
(74) *Attorney, Agent, or Firm* — Locke Lord LLP; James E. Armstrong, IV; Nicholas J. DiCeglie, Jr.

(57) ABSTRACT

There is provided an insulating resin circuit substrate including an insulating resin layer and a circuit layer consisting of a plurality of metal pieces disposed to be spaced apart in a circuit pattern shape on one surface of the insulating resin layer, in which in a case where a surface of the insulating resin layer in a gap between the metal pieces is analyzed by SEM-EDX, the area rate of a metal element constituting the metal pieces is less than 2.5%.

8 Claims, 6 Drawing Sheets

INSULATING RESIN CIRCUIT SUBSTRATE

The present invention relates to an insulating resin circuit substrate including an insulating resin layer and a circuit layer consisting of a plurality of metal pieces disposed to be spaced apart in a circuit pattern shape on one surface of the insulating resin layer.

Priority is claimed on Japanese Patent Application No. 2020-095304, filed Jun. 1, 2020, the content of which is incorporated herein by reference.

BACKGROUND ART

A power module, an LED module, and a thermoelectric module have a structure in which a power semiconductor element, an LED element, and a thermoelectric element are joined to the insulating circuit substrate in which a circuit layer made of a conductive material is formed on one surface of an insulating layer.

As the above-described insulating circuit substrate, for example, a metal-based circuit substrate disclosed in Patent Document 1 has been proposed.

In the metal-based circuit substrate disclosed in Patent Document 1, the insulating resin layer is formed on a metal substrate, and the circuit layer having a circuit pattern is formed on the insulating resin layer. Here, the insulating resin layer is made of an epoxy resin which is a thermosetting resin, and the circuit layer is made of a copper foil.

In the metal-based circuit substrate, the semiconductor element is joined on the circuit layer, and a heat sink is disposed on a surface of the metal substrate on a side opposite to the insulating resin layer, and heat generated by the semiconductor element is transmitted to the heat sink side and is radiated.

Then, in the metal-based circuit substrate disclosed in Patent Document 1, a circuit pattern is formed by subjecting the copper foil disposed on the insulating resin layer to an etching treatment.

CITATION LIST

Patent Document

[Patent Document 1]
Japanese Unexamined Patent Application, First Publication No. 2015-207666

Technical Problem

SUMMARY OF INVENTION

By the way, in a case where a circuit pattern is formed by subjecting a copper foil to an etching treatment as described in Patent Document 1, copper cannot be completely dissolved by the etching treatment, and thus a copper residue remains in the insulating resin layer in a gap between the circuit patterns, and as a result, there is a risk that poor insulation between the circuit patterns occurs.

In particular, recently, the current applied to the semiconductor element mounted on the circuit layer tends to increase, and the amount of heat generated from the semiconductor element also increases accordingly. Accordingly, in order to ensure conductivity and thermal conductivity, it is required to thicken the circuit layer. For this reason, a copper residue tends to remain in the insulating resin layer in a gap between the circuit patterns after the etching treatment, which tends to cause poor insulation between the circuit patterns.

The present invention has been made in consideration of the above-described circumstances, and an object of the present invention is to provide an insulating resin circuit substrate which has excellent insulating properties between circuit patterns and can be used stably.

Solution to Problem

In order to solve the above problems, the insulating resin circuit substrate according to the present invention is characterized by including an insulating resin layer and a circuit layer consisting of a plurality of metal pieces disposed to be spaced apart in a circuit pattern shape on one surface of the insulating resin layer, in which in a case where a surface of the insulating resin layer in a gap between the metal pieces is analyzed by SEM-EDX, the area rate of a metal element constituting the metal pieces is less than 2.5%.

According to the insulating resin circuit substrate of this configuration, in a case where a surface of the insulating resin layer in a gap between the metal pieces constituting the circuit layer (between the circuit patterns) is analyzed by SEM-EDX, the area rate of a metal element constituting the metal pieces is less than 2.5%, and thus it is possible to suppress the occurrence of poor insulation between the circuit patterns and it is possible to stably use the insulating resin circuit substrate.

Here, in the insulating resin circuit substrate according to the present invention, it is preferable that a heat radiation layer is formed on a surface of the insulating resin layer on a side opposite to the circuit layer, in a region of the heat radiation layer, a joining rate of the insulating resin layer to the heat radiation layer is 70% or more, where the region is located on a back surface of the gap between the metal pieces of the circuit layer, and the heat radiation layer is made of a material having a thermal conductivity higher than a thermal conductivity of the insulating resin layer.

In this case, a heat radiation layer made of a material having a thermal conductivity higher than a thermal conductivity of the insulating resin layer is formed on the surface of the insulating resin layer on a side opposite to the circuit layer, this heat radiation layer enables the heat on the circuit layer side to be radiated efficiently. In addition, since in the region of the heat radiation layer, the joining rate of the insulating resin layer to the heat radiation layer is 70% or more, where the region is located on a back surface of the gap between the metal pieces of the circuit layer, the insulating resin layer and the heat radiation layer are reliably joined, and the heat from a side of the insulating resin layer can be more efficiently radiated by the heat radiation layer.

In addition, in the insulating resin circuit substrate according to the present invention, it is preferable that the thickness t of the metal piece is 0.5 mm or more.

In this case, since the thickness t of the metal piece constituting the circuit layer is 0.5 mm or more, it is possible to ensure conductivity while spreading heat in the plane direction in the circuit layer, thereby obtaining excellent heat radiation characteristics are obtained.

Further, in the insulating resin circuit substrate according to the present invention, it is preferable that the ratio L/t of the closest distance L between the metal pieces to the thickness t of the metal piece disposed in the circuit pattern shape is 2.0 or less.

In this case, since the ratio L/t of the closest distance L between the metal pieces to the thickness t of the metal piece is 2.0 or less, it is possible to reduce the size and the weight of parts using this insulating resin circuit substrate. Further, since the area rate of the metal element on the surface of the insulating resin layer in a gap between the metal pieces (between the circuit patterns) is less than 2.5%, it is possible to ensure insulating properties between circuit patterns even in a case where the closest distance L is short.

Advantageous Effects of Invention

According to the present invention, it is possible to provide an insulating resin circuit substrate which has excellent insulating properties between circuit patterns and can be used stably.

DESCRIPTION OF EMBODIMENTS

Hereinafter, embodiments according to the present invention will be described with reference to the accompanying drawings.

Figure 1:
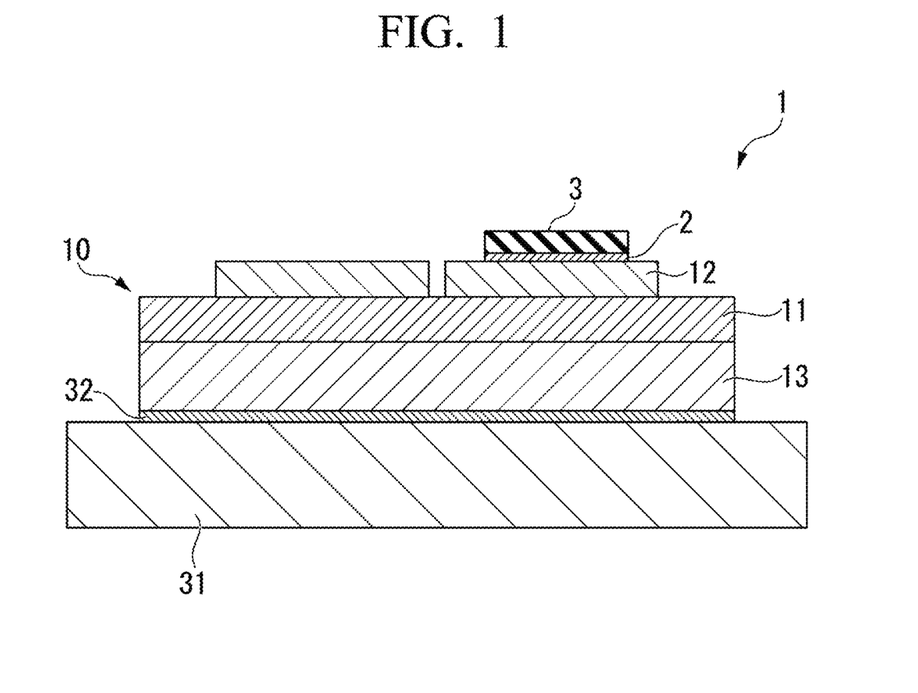
FIG. 1 is a cross-sectional explanatory view of a power module using an insulating resin circuit substrate which is an embodiment according to the present invention.

FIG. 1 shows an insulating resin circuit substrate 10 which is an embodiment according to the present invention and a power module 1 using the insulating resin circuit substrate 10.

The power module 1 includes the insulating resin circuit substrate 10, a semiconductor element 3 joined to one side (the upper side in FIG. 1) of the insulating resin circuit substrate 10 via a solder layer 2, and a heat sink 31 joined to the other side (the lower side in FIG. 1) of the insulating resin circuit substrate 10 via a solder layer 32.

The solder layers 2 and 32 are, for example, Sn—Ag-based, Sn—Cu-based, Sn—In-based, or Sn—Ag—Cu-based solder materials (so-called lead-free solder materials).

The semiconductor element 3 is an electronic component including a semiconductor, and various semiconductor elements are selected according to a required function.

Figure 2:
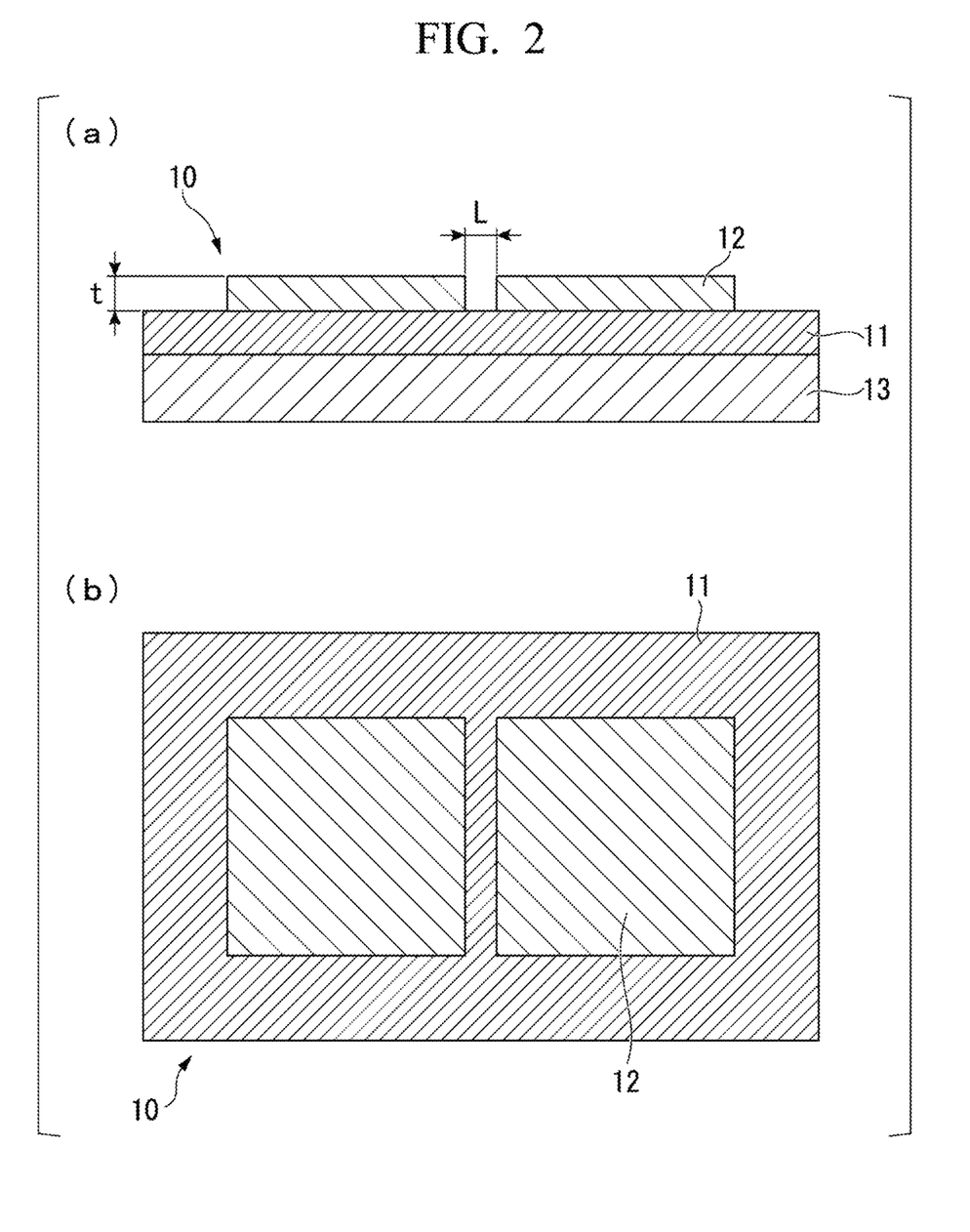
FIG. 2 is an explanatory view of an insulating resin circuit substrate, which is an embodiment according to the present invention. Here, (a) is a cross-sectional view, and (b) is a top view.

As shown in FIG. 1 and FIG. 2 (a), the insulating resin circuit substrate 10 includes an insulating resin layer 11, a circuit layer 12 formed on one surface (the upper surface in FIG. 1 and FIG. 2 (a)) of the insulating resin layer 11, and a heat radiation layer 13 formed on the other surface (the lower surface in FIG. 1 and FIG. 2 (a)) of the insulating resin layer 11.

The insulating resin layer 11 prevents the electrical connection between the circuit layer 12 and the heat radiation layer 13, and it is made of a thermosetting resin having insulating properties. In the present embodiment, it is also possible to use a thermosetting resin containing a filler in order to ensure the hardness of the insulating resin layer 11.

Here, as the filler, for example, alumina, boron nitride, aluminum nitride, and the like can be used. In addition, as the thermosetting resin, an epoxy resin, polyimide, or the like can be used.

In the present embodiment, the insulating resin layer 11 is made of polyimide. Further, the thickness of the insulating resin layer 11 is set to be within a range of 20 μm or more and 250 μm or less.

As shown in FIGS. 4(a) to 4(d), the circuit layer 12 is formed by joining the metal piece 22 made of a metal having excellent conductivity to one surface (the upper surface in FIGS. 4(a) to 4(d)) of the insulating resin layer 11. As the metal piece 22, the metal piece formed by subjecting a metal plate to a punching process can be used. In the present embodiment, as the metal piece 22 constituting the circuit layer 12, a metal piece obtained by subjecting a rolled plate of oxygen-free copper (OFC) to a punching process is used. As the metal piece 22, it is also possible to use a metal piece obtained by subjecting copper such as tough pitch copper or a copper alloy to a punching process.

In the circuit layer 12, a circuit pattern is formed by disposing the metal piece 22 in a circuit pattern shape, and one surface (the upper surface in FIG. 1) of the circuit pattern is a mounting surface on which the semiconductor element 3 is mounted.

Here, the thickness t of the circuit layer 12 (metal piece 22) is 0.5 mm or more. It is noted that the thickness t of the circuit layer 12 (metal piece 22) is preferably 1.0 mm or more, and more preferably 1.5 mm or more. In addition, although the upper limit of the thickness t of the circuit layer 12 (metal piece 22) is not particularly limited, it is practically 4.0 mm or less.

The closest distance L between the metal pieces 22 disposed in a circuit pattern shape, which is shown in FIG. 2(a), is preferably set such that the ratio L/t to the thickness t of the metal piece 22 disposed in a circuit pattern shape is 2.0 or less. It is noted that L/t is more preferably 1.0 or less and still more preferably 0.5 or less. Although the lower limit value of L/t is not particularly limited, it is practically 0.2.

Specifically, in the present embodiment, the closest distance L between the metal pieces 22 disposed in a circuit pattern shape is set to be within a range of 0.5 mm or more and 2.0 mm or less.

The heat radiation layer 13 has an effect of improving the heat radiation characteristics by spreading heat generated in the semiconductor element 3 mounted on the insulating resin circuit substrate 10 in the plane direction. Therefore, the heat radiation layer 13 is made of a metal having excellent thermal conductivity, for example, copper, a copper alloy, aluminum or an aluminum alloy.

These metals tend to have high thermal conductivity as compared with thermosetting resin and the filler, which are used in the insulating resin layer 11.

In the present embodiment, it is made of a rolled plate of oxygen-free copper. In addition, the thickness of the heat radiation layer 13 is set to be within a range of 0.05 mm or more and 3 mm or less.

Further, in the insulating resin circuit substrate 10 of the present embodiment, as a result of analyzing the surface of the insulating resin layer 11 located in a gap between the metal pieces 22 (between the circuit patterns) constituting the circuit layer 12 by SEM-EDX, the area rate of the metal element constituting the metal piece 22 is less than 2.5%. The area rate of the metal element is more preferably 1.0% or less.

In addition, the lower limit value of the area rate of the metal element on the surface of the insulating resin layer 11 located in a gap between the metal pieces 22 (between the circuit patterns) is 0%.

In the present embodiment, as described above, the metal piece 22 is composed of a metal piece obtained by subjecting a rolled plate of oxygen-free copper to a punching process, and thus the area rate of the Cu element on the surface of the insulating resin layer 11 located in a gap between the metal pieces 22 (between the circuit patterns) is less than 2.5%.

In the insulating resin circuit substrate 10 according to the present embodiment, it is preferable that in a region of the heat radiation layer 13, the joining rate of the insulating resin layer 11 to the heat radiation layer 13 is 70% or more, where the region is located on a back surface of the gap between the metal pieces 22 of the circuit layer 12 (between the circuit patterns).

The joining rate is more preferably 90% or more, and the upper limit value of the joining rate is preferably 100%.

It is noted that the joining rate was evaluated using an ultrasonic flaw detector and calculated according to the following expression. Here, the initial joining area is the area to be joined before joining.

(Joining rate)={(initial joining area)−(peeling area)}/(initial joining area)×100

The heat sink 31 is for radiating heat on the side of the insulating resin circuit substrate 10. The heat sink 31 is made of copper or a copper alloy, aluminum, an aluminum alloy, or the like having good thermal conductivity. In the present embodiment, a heat radiation plate is made of the oxygen-free copper. It is noted that the thickness of the heat sink 31 is set to be within a range of 3 mm or more and 10 mm or less.

Here, the heat radiation layer 13 of the insulating resin circuit substrate 10 and the heat sink 31 are joined via the solder layer 32.

Figure 3:
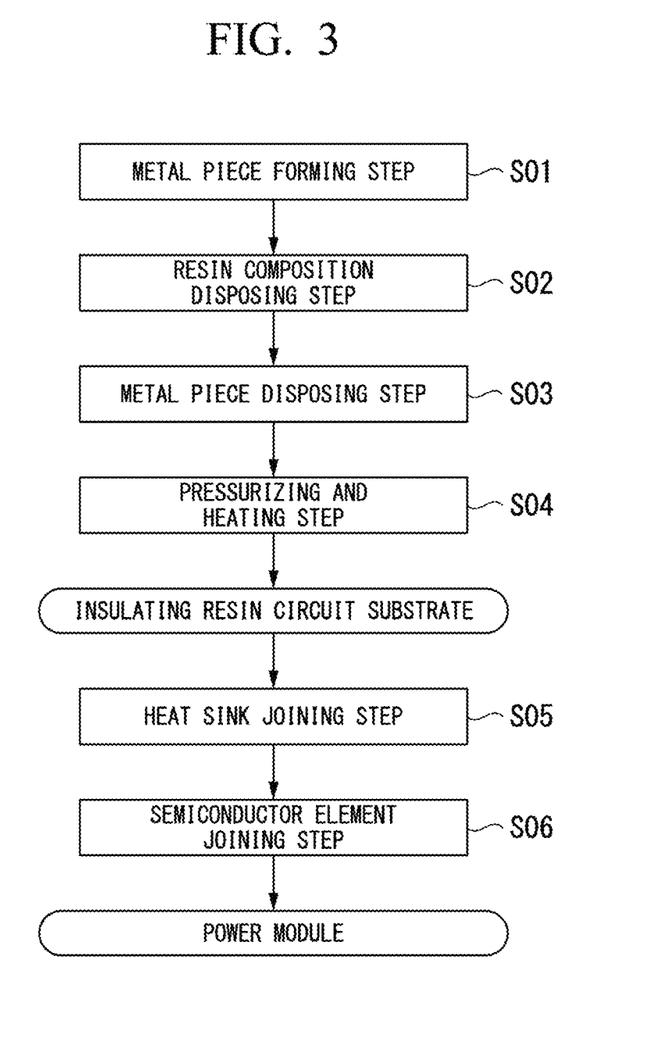
FIG. 3 is a flowchart showing an example of the manufacturing method for an insulating resin circuit substrate, which is the embodiment according to the present invention.
Figure 4:
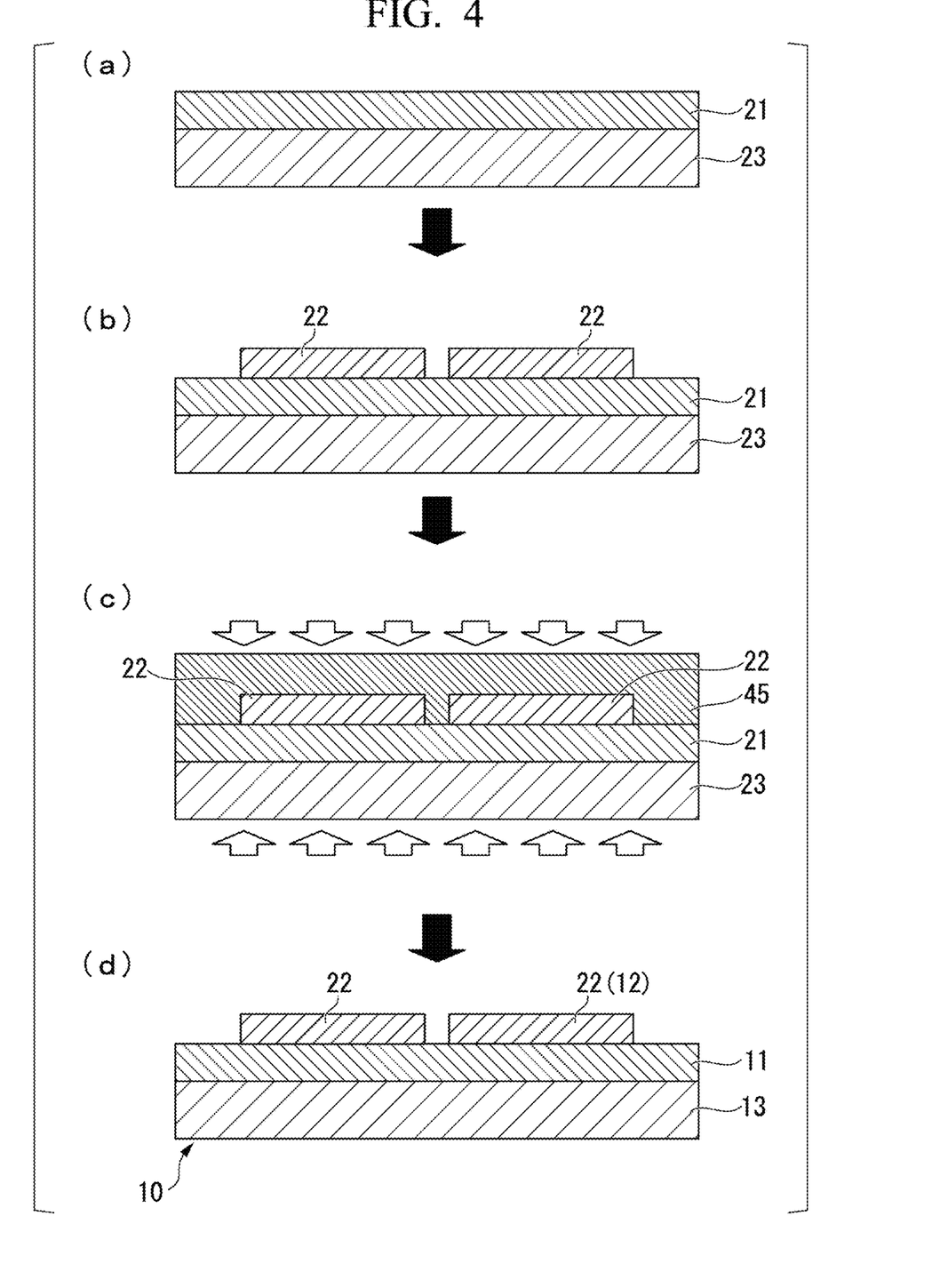
FIG. 4 is an explanatory view showing an example of the manufacturing method for an insulating resin circuit substrate, which is the embodiment according to the present invention. Here, (a) shows a resin composition disposing step S02, (b) shows a metal piece disposing step S03, (c) shows a pressurizing and heating step S04, and (d) shows an insulating resin circuit substrate 10 obtained by the above steps.

Hereinafter, a manufacturing method for the insulating resin circuit substrate according to the present embodiment will be described with reference to FIGS. 3 and FIGS. 4(a) to 4(d).

Metal Piece Forming Step S01

First, the metal piece 22 to serve as the circuit layer 12 is formed. The metal plate (the rolled plate of the oxygen-free copper in the present embodiment) is subjected to a punching process to form the metal piece 22.

Resin Composition Disposing Step S02

Next, as shown in FIG. 4(a), a resin composition 21 that becomes the insulating resin layer 11 is disposed on one surface (the upper surface in FIG. 4(a)) of the metal plate 23 to serve as the heat radiation layer 13. In the present embodiment, a resin sheet material made of a polyimide resin is used as the resin composition 21.

Metal Piece Disposing Step S03

Next, a plurality of metal pieces 22 are disposed in a circuit pattern shape on one surface (the upper surface in FIG. 4(b)) of the resin composition 21.

Pressurizing and Heating Step S04

Next, as shown in FIG. 4(c), the metal plate 23 to serve as the heat radiation layer 13, the resin composition 21, and the metal piece 22 are pressurized while being heated in the laminating direction, whereby the metal plate 23 and the insulating resin layer 11, and the insulating resin layer 11 and the metal piece 22 are joined to form the heat radiation layer 13 and the circuit layer 12.

Here, in the present embodiment, the pressurizing and heating step S04 is configured so that a rubber-like elastic body 45 is disposed on a side of the metal piece 22 to pressurize the metal piece 22 toward a side of the resin composition 21.

In the present embodiment, the rubber-like elastic body 45 is made of, for example, silicone rubber, or the like. Since the pressurization is carried out using this rubber-like elastic body 45, it is possible to sufficiently pressurize the resin composition 21 and the metal plate 23 in the laminating direction even in a region where the metal piece 22 is not disposed.

In addition, in the pressurizing and heating step S04, the heating temperature is set to be within a range of 120° C. or more and 350° C. or less, and a holding time at the heating temperature is set to be within a range of 10 minutes or more and 180 minutes or less. Further, the pressurization load in the laminating direction is within a range of 1 MPa or more and 30 MPa or less.

Here, the lower limit of the heating temperature is preferably 150° C. or higher and more preferably 170° C. or higher. On the other hand, the upper limit of the heating temperature is preferably 250° C. or lower and more preferably 200° C. or lower.

The lower limit of the holding time at the heating temperature is preferably 30 minutes or more and more preferably 60 minutes or more. On the other hand, the upper limit of the holding time at the heating temperature is preferably 120 minutes or less and more preferably 90 minutes or less.

The lower limit of the pressurization load in the laminating direction is preferably 5 MPa or more and more preferably 8 MPa or more. On the other hand, the upper limit of the pressurization load in the laminating direction is preferably 15 MPa or less and more preferably 10 MPa or less.

As shown in FIG. 4(d), the insulating resin circuit substrate 10 which is the present embodiment is manufactured according to each of the steps described above.

Heat Sink Joining Step S05

Next, the heat sink 31 is joined to the other surface of the heat radiation layer 13 of the insulating resin circuit substrate 10. In the present embodiment, the heat radiation layer 13 and the heat sink 31 are joined via the solder material.

Semiconductor Element Joining Step S06

Then, the semiconductor element 3 is joined to the circuit layer 12 of the insulating resin circuit substrate 10. In the present embodiment, the circuit layer 12 and the semiconductor element 3 are joined via a solder material.

According to the above steps, the power module 1 shown in FIG. 1 is manufactured.

According to the insulating resin circuit substrate 10 configured as described above, which is the present embodiment, in a case where the surface of the insulating resin layer 11 in a gap between the metal pieces 22 and 22 (between the circuit patterns) constituting the circuit layer 12 is analyzed by SEM-EDX, the area rate of the metal element (the Cu element in the present embodiment) constituting the metal piece 22 is less than 2.5%, and thus it is possible to suppress the occurrence of poor insulation between the circuit patterns.

In the present embodiment, the heat radiation layer 13 is formed on the surface of the insulating resin layer 11 on a side opposite to the circuit layer 12, and thus this heat radiation layer 13 enables the heat on a side of the circuit layer 12 to be radiated efficiently.

In addition, in a case where in a region of the heat radiation layer 13, the joining rate of the insulating resin layer 11 to the heat radiation layer 13 is 70% or more, where the region is located on a back surface of the gap between the metal pieces 22 and 22 of the circuit layer 12, the insulating resin layer 11 and the heat radiation layer 13 are reliably joined, and the heat from a side of the insulating resin layer 11 can be more efficiently radiated by the heat radiation layer 13.

It is noted that in the present embodiment, the pressurizing and heating step S04 is configured so that the rubber-like elastic body 45 is disposed to pressurize the metal piece 22 toward a side of the resin composition 21, and thus it is possible to sufficiently pressurize the resin composition 21 and the metal plate 23 in the laminating direction even in a region where the metal piece 22 is not disposed, and it is possible to set the joining rate of the insulating resin layer 11 to the heat radiation layer 13 to be 95% or more, in a region located on a back surface of the gap between the metal pieces 22 and 22 of the circuit layer 12.

Further, in the present embodiment, in a case where the thickness t of the metal piece 22 constituting the circuit layer 12 is 0.5 mm or more, conductivity and heat radiation characteristics are excellent, and thus it is possible to favorably apply to a use application in which a large current and high voltage are applied. In addition, heat can be spread in the plane direction in the circuit layer 12, and thus the heat radiation characteristics are excellent.

Further, in the present embodiment, in a case where the ratio L/t of the closest distance L between the metal pieces 22 and 22 to the thickness t of the metal piece 22 disposed in a circuit pattern shape is 2.0 or less, it is possible to reduce the size and the weight of parts using this insulating resin circuit substrate 10. Furthermore, as described above, in a case where the surface of the insulating resin layer 11 in a gap between the metal pieces 22 and 22 (between the circuit patterns) is analyzed by SEM-EDX, the area rate of the metal element (the Cu element in the present embodiment) constituting the metal piece 22 is less than 2.5%, and thus it is possible to suppress the occurrence of poor insulation between the circuit patterns even in a case where the above ratio L/t of the closest distance L between the metal pieces 22 and 22 is 2.0 or less.

The embodiments according to the present invention have been described as above; however, the present invention is not limited to this, and they can be appropriately changed without departing from the technical ideas of the present invention.

For example, it has been described in the present embodiment that a power semiconductor element is mounted on the circuit layer of the insulating resin circuit substrate to constitute a power module; however, the present invention is not limited to this. For example, an LED element may be mounted on an insulating resin circuit substrate to form an LED module, or a thermoelectric element may be mounted on a circuit layer of an insulating resin circuit substrate to form a thermoelectric module.

In addition, although it has been described in the present embodiment that the insulating resin circuit substrate and the heat sink are joined via the solder layer, the present invention is not limited to this, and the insulating resin circuit substrate (the metal substrate) and the heat sink may be laminated via grease.

Further, the material and structure of the heat sink are not limited to the present embodiment, and the design may be changed as appropriate.

Although it has been described in the present embodiment that the insulating resin layer is made of polyimide, the insulating resin layer is not limited thereto and may be made of an epoxy resin or the like.

In addition, although it has been described in the present embodiment that the metal piece is made of oxygen-free copper, the metal piece is not limited thereto and may be made of any other metal material such as copper or a copper alloy, aluminum, or silver.

In addition, although it has been described in the present embodiment that the pressurization is carried out using a rubber-like elastic body in the pressurizing and heating step, the present embodiment is not limited thereto, and a rubber-like elastic body may not be used.

Although it has been described in the present embodiment that the metal piece forming step S01 of forming the metal piece 22 is provided by punching the metal plate, the present invention is not limited to this, and metal pieces formed by other means may be used.

EXAMPLES

Hereinafter, the results of confirmation experiments carried out to confirm the effects of the present invention will be described.

The rolled plate of the oxygen-free copper (60 mm×40 mm×thickness 1.0 mm) is prepared as a metal plate to serve as the heat radiation layer, and a sheet material of the resin composition shown in Table 1 is disposed on one surface of the metal plate.

In Examples 1 and 2 according to the present invention, the metal piece (20 mm×20 mm) shown in Table 1 was disposed in a pattern shape on one surface of the resin composition. At this time, the metal pieces are disposed so that the closest distance between the metal pieces is a value shown in Table 1.

In Comparative Example, the metal plate (60 mm×40 mm) shown in Table 1 was disposed on one surface of the resin composition.

It is noted that the ratio L/t of the closest distance L between the metal pieces to the thickness t of the metal piece is L/t=1.0 in Examples 1 and 2 according to the present invention, and it is L/t=2.0 in Comparative Example.

Then, as the pressurizing and heating step, the metal plate, the resin composition, and the metal piece were pressurized and heated in the laminating direction to cure the resin composition, thereby forming the insulating resin layer and joining the metal plate, the insulating resin layer, and the metal piece (the metal plate). It is noted that the conditions for the pressurizing and heating step were as follows; a pressurization load of 3 MPa, a heating temperature of 300° C., and a holding time at the heating temperature of 1 hour.

At this time, in Example 1 according to the present invention, a rubber-like elastic body (thickness: 4.0 mm) consisting of silicone rubber was disposed on one side of the metal piece and pressurized in the laminating direction. In addition, in Example 2 according to the present invention, the pressurization was carried out without using the rubber-like elastic body.

In addition, in Comparative Example, after joining the metal plate and the insulating resin layer in the same manner as in Example 1 according to the present invention, the metal plate to serve as the circuit layer was subjected to an etching treatment, and a circuit pattern was formed so that the closest distance was the value shown in Table 1.

Regarding the insulating resin circuit substrate obtained as described above, the area rate of the metal element on the surface of the insulating resin layer in a gap between the metal pieces was measured, and the joining rate and the voltage resistance of the insulating resin layer to the heat radiation layer in a region of the heat radiation layer, where the region is located on a back surface of the gap between the metal pieces of the circuit layer, were evaluated as follows.

(Area Rate of Metal Element on Surface of Insulating Resin Layer in Gap Between Metal Pieces)

Regarding the obtained insulating resin circuit substrate, the surface of the insulating resin layer in a gap between the metal pieces was observed using SEM-EDX (SU8230 manufactured by Hitachi High-Tech Corporation) at an acceleration voltage of 6 kV and a magnification of 1,000 times, and the mapping analysis of the Cu element was carried out to calculate the area rate of the Cu element from the obtained EDX image (10 visual fields). It is noted that the image analysis software "Image J" was used to calculate the area rate. The evaluation results are shown in Table 1. In addition, FIGS. 5A and 5B show the analysis results of Example 1 according to the present invention and Comparative Example.

Figure 5A:
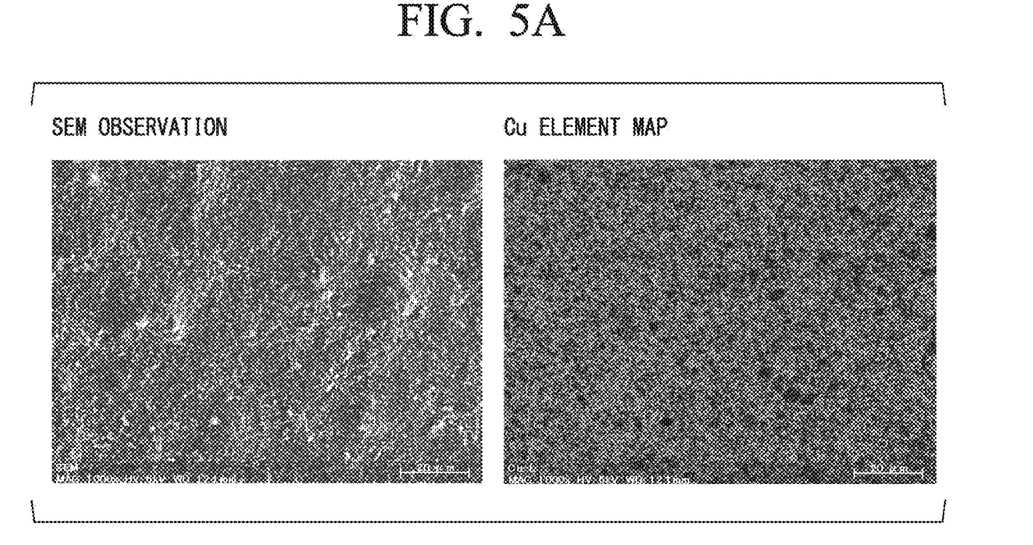
FIG. 5A is a view showing the results obtained by, by SEM-EDX, analyzing the surface of the insulating resin layer in a gap between the metal pieces constituting the circuit layer of the insulating resin circuit substrate in Example 1 according to the present invention.
Figure 5B:
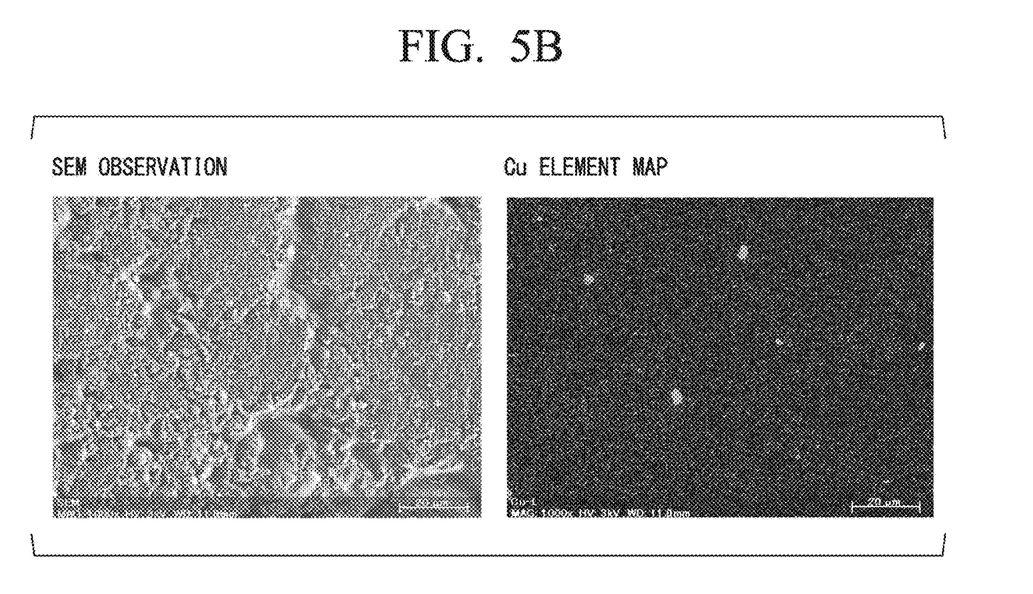
FIG. 5B is a view showing the results obtained by, by SEM-EDX, analyzing the surface of the insulating resin layer in a gap between the metal pieces constituting the circuit layer of the insulating resin circuit substrate in Comparative Example.

As shown in FIG. 5A, in Example 1 according to the present invention, almost the entire surface of the Cu element map was at the background level, and Cu was not detected. As shown in FIG. 5B, Cu was detected in Comparative Example.

(Joining Rate in Region of Heat Radiation Layer, where Region is Located on Back Surface of Gap Between Metal Pieces of Circuit Layer)

The evaluation was carried out using an ultrasonic flaw detector (FineSAT 200 manufactured by Hitachi Power Solutions Co., Ltd.) and calculated according to the following expression. The evaluation results are shown in Table 1.

Here, the initial joining area is the area to be joined before joining. In the image obtained by subjecting the ultrasonic flaw detection image to the binarization process, the peeling is indicated by a white portion in the joining part, and thus the area of this white portion was defined as the peeling area.

(Joining rate)={(initial joining area)−(peeling area)}/(initial joining area)×100

(Voltage Resistance)

Figure 6:
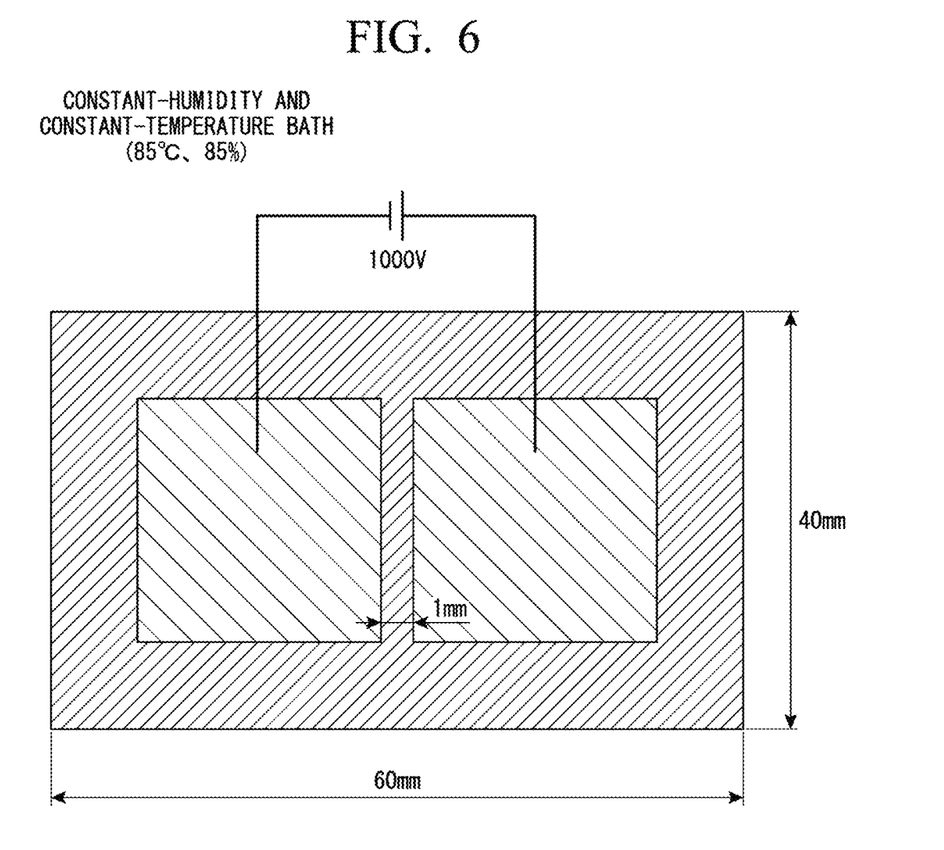
FIG. 6 is a schematic explanatory view of a test device for evaluating the voltage resistance of insulating resin circuit substrates in Examples.

As shown in FIG. 6, the insulating resin circuit substrate was disposed in the inside of a constant-humidity and constant-temperature bath (temperature: 85° C., humidity: 85%), and a voltage of DC 1,000 V was applied to the insulating resin circuit substrate. After 2,000 hours, the insulation resistance between the metal pieces was measured, and a case where the value of the insulation resistance was more than $1.0\times10^6\Omega$ was evaluated as "A (acceptable)", and a case where it was $1.0\times10^6\Omega$ or less was evaluated as "B (unacceptable)". The evaluation results are shown in Table 1.

TABLE 1

| | Insulating resin layer | Circuit layer | | | | Heat radiation layer | | Cu area rate surface on resin between circuits (mm) | Evaluation | |
|---|---|---|---|---|---|---|---|---|---|---|
| | Resin material | Material | Thickness (mm) | Closest distance (mm) | Forming method for circuit pattern | Material | Thickness (mm) | | Voltage resistance | Joining rate of Heat radiation layer |
| Example 1 | Polyimide | OFC | 1.0 | 1.0 | Metal piece joining (in present of rubber-like elastic body) | OFC | 1.0 | 0 | A | 100% |
| Example 2 | Polyimide | OFC | 1.0 | 1.0 | Metal piece joining (in absence of rubber-like elastic body) | OFC | 1.0 | 0 | A | 71% |
| Comparative example | Polyimide | OFC | 0.5 | 1.0 | Etching | OFC | 1.0 | 2.66 | B | 100% |

In Comparative Example in which a circuit layer having a circuit pattern was formed according to the etching step, as shown in FIG. 5B, a large amount of the Cu element was confirmed on the surface of the insulating resin layer in a gap between the metal pieces, and the area rate of the metal element on the surface of the insulating resin layer in a gap between the metal pieces was 2.66%. As a result, the voltage resistance was "B". It is presumed that the insulation resistance decreased since migration occurred on the surface of the insulating resin layer in a gap between the metal pieces.

On the other hand, in Examples 1 and 2 according to the present invention in which the circuit layer was formed by disposing and joining the metal pieces in a circuit pattern shape, as shown in FIG. 5A, the Cu element was not confirmed on the surface of the insulating resin layer in a gap between the metal pieces, and the area rate of the metal element on the surface of the insulating resin layer in a gap between the metal pieces was 0%. As a result, the voltage resistance was "A".

In addition, in the pressurizing and heating step, in Example 1 according to the present invention using the rubber-like elastic body, the joining rate in the region of the heat radiation layer was 100%, where the region was located on the back surface of the gap between the metal pieces of the circuit layer.

From the above results, it has been confirmed that according to the examples of the present invention, it is possible to provide an insulating resin circuit substrate which has excellent insulating properties between circuit patterns and can be used stably.

REFERENCE SIGNS LIST

1: Power module
3: Semiconductor element
10: Insulating resin circuit substrate
11: Insulating resin layer
12: Circuit layer
13: Heat radiation layer
21: Resin composition
22: Metal piece
23: Metal plate
45: Rubber-like elastic body

What is claimed is:

1. An insulating resin circuit substrate comprising:
an insulating resin layer;
a circuit layer consisting of a plurality of metal pieces disposed to be spaced apart in a circuit pattern shape on one surface of the insulating resin layer; and
a heat radiation layer is formed on a surface of the insulating resin layer on a side opposite to the circuit layer,
wherein in a case where a surface of the insulating resin layer in a gap between the metal pieces is analyzed by SEM-EDX, an area rate of a metal element constituting the metal pieces is less than 2.5%,
the insulating resin layer prevents the electrical connection between the circuit layer and the heat radiation layer,
in a region of the heat radiation layer, a joining rate of the insulating resin layer to the heat radiation layer is 70% or more, where the region is located on a back surface of the gap between the metal pieces of the circuit layer, and
the heat radiation layer is made of a material having a thermal conductivity higher than a thermal conductivity of the insulating resin layer.

2. The insulating resin circuit substrate according to claim 1,
wherein the metal piece has a thickness t of 0.5 mm or more.

3. The insulating resin circuit substrate according to claim 1,
wherein a ratio $L/t$ of a closest distance $L$ between the metal pieces to a thickness $t$ of the metal piece disposed in the circuit pattern shape is 2.0 or less.

4. The insulating resin circuit substrate according to claim 1,
wherein the insulating resin layer consist of a thermosetting resin having insulating properties and one or more fillers selected from a group consisting of alumina, boron nitride, and aluminum nitride.

5. The insulating resin circuit substrate according to claim 1,
wherein the plurality of metal pieces consists of one material selected from a group consisting of an oxygen-free copper, a tough pitch copper, and a copper alloy.

6. The insulating resin circuit substrate according to claim 1,
wherein each of the plurality of metal pieces is composed of a punched metal plate.

7. The insulating resin circuit substrate according to claim 1,
wherein a closest distance $L$ between the metal pieces disposed in a circuit pattern shape is set such that a ratio $L/t$ to a thickness $t$ of the metal pieces is 2.0 or less.

8. The insulating resin circuit substrate according to claim 7, wherein the ratio $L/t$ is 1.0 or less.

* * * * *